(12) United States Patent
Cheng et al.

(10) Patent No.: US 10,319,751 B2
(45) Date of Patent: Jun. 11, 2019

(54) DISPLAY SUBSTRATE AND MANUFACTURING METHOD THEREOF, AND FLEXIBLE DISPLAY DEVICE HAVING DISPLAY SUBSTRATE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 14/403,692

(22) PCT Filed: May 22, 2014

(86) PCT No.: PCT/CN2014/078073
§ 371 (c)(1),
(2) Date: Nov. 25, 2014

(87) PCT Pub. No.: WO2015/067028
PCT Pub. Date: May 14, 2015

(65) Prior Publication Data
US 2015/0287747 A1    Oct. 8, 2015

(30) Foreign Application Priority Data
Nov. 11, 2013   (CN) .......................... 2013 1 0557272

(51) Int. Cl.
*H01L 27/12* (2006.01)
*G02F 1/1333* (2006.01)
*H01L 27/32* (2006.01)

(52) U.S. Cl.
CPC .... *H01L 27/1248* (2013.01); *G02F 1/133305* (2013.01); *G02F 1/133345* (2013.01);
(Continued)

(58) Field of Classification Search
CPC .................. H01L 27/1248; H01L 27/3258
(Continued)

(56) References Cited

U.S. PATENT DOCUMENTS 7,973,316 B2 * 7/2011 Ohnuma ............. H01L 23/3135
257/368
2006/0202206 A1 * 9/2006 Koyama ............. H01L 27/1214
257/67
(Continued)

FOREIGN PATENT DOCUMENTS

CN          101241915 A      8/2008
CN          102790094 A      11/2012
(Continued)

OTHER PUBLICATIONS

1st Office Action issued in Chinese Application No. 201310557272.7 dated Jun. 26, 2015.
(Continued)

*Primary Examiner* — Meiya Li
*Assistant Examiner* — Peter M Albrecht
(74) *Attorney, Agent, or Firm* — Nath, Goldberg & Meyer; Joshua B. Goldberg; Daniel Bissing

(57) ABSTRACT

The present invention provides a display substrate and a manufacturing method thereof, and a flexible display device having the display substrate, which belong to the field of display technology, and can solve the problem of poor reliability of display substrates due to the damage to thin film transistors when the existing display substrates are bent. In the display substrate provided by the present invention, by introducing stress absorption units made of resin material into the display substrate, the stress generated by the display substrate being bent is released by the resin material, and thin film transistors on the display substrate are thus less (Continued)

likely to be damaged, so that the reliability of the whole display substrate is improved.

12 Claims, 1 Drawing Sheet

(52) U.S. Cl.
CPC .......... *H01L 27/124* (2013.01); *H01L 27/127* (2013.01); *H01L 27/1218* (2013.01); *H01L 27/3244* (2013.01); *G02F 2201/07* (2013.01); *G02F 2201/503* (2013.01)

(58) Field of Classification Search
USPC .......................................................... 257/72
See application file for complete search history.

(56) References Cited

U.S. PATENT DOCUMENTS

| 2006/0220551 | A1 | 10/2006 | Yamazaki |
| 2015/0108484 | A1* | 4/2015 | Park .................... H01L 27/1255 257/71 |

FOREIGN PATENT DOCUMENTS

| CN | 103545321 A | | 1/2014 |
| KR | 20120072949 A | * | 7/2012 |

OTHER PUBLICATIONS

Search Report issued in International Application No. PCT/CN2014/078073, fourteen (14) pages.

* cited by examiner

DISPLAY SUBSTRATE AND MANUFACTURING METHOD THEREOF, AND FLEXIBLE DISPLAY DEVICE HAVING DISPLAY SUBSTRATE

This is a National Phase Application filed under 35 U.S.C. 371 as a national stage of PCT/CN2014/078073, filed May 22, 2014, and claims priority benefit from Chinese Application No. 201310557272.7, filed Nov. 11, 2013, the content of each of which is hereby incorporated by reference in its entirety.

FIELD OF THE INVENTION

The present invention belongs to the field of display technology, and particularly to a display substrate and a manufacturing method thereof, and a flexible display device having the display substrate.

BACKGROUND OF THE INVENTION

Flexible display devices have many advantages, for example, impact resistance, high shock resistance, light weight, small size, convenience to carry, etc. At present, main flexible display materials may be roughly classified into three types: electronic paper (or flexible electrophoretic display), flexible Organic Light-Emitting Diodes (OLED) and flexible liquid crystals, etc.

A flexible display device includes a display substrate including a flexible base substrate and a structure located on the flexible base substrate, wherein the flexible base substrate is a polyimide (PI) base substrate, a polyethylene glycol terephthalate (PET) base substrate, etc; and the structure on the flexible base substrate includes thin film transistors (TFTs). Usually, the display substrate of the flexible display device in the prior art is provided therein with insulating layers, for example, gate insulating layer, interlayer insulating layer and passivation layer. The insulating layers are generally made of $SiN_x$ or $SiO_x$ materials, so the insulating layers have poor flexibility. As a result, it is likely to fracture the insulating layers when the flexible display device is bent, so that the TFTs on the display substrate of the flexible display device are easy to be damaged. For example, the generated stress when the display substrate is bent may result in the fracture of the TFTs, so the performances of the TFTs will certainly be influenced, thereby influencing the reliability of the flexible display device and causing adverse effects on the display quality.

SUMMARY OF THE INVENTION

An object of the present invention is to solve the problem of poor reliability of display substrates due to the damage to thin film transistors when the display substrates in the prior art are bent, and to provide a display substrate of high reliability.

To solve the technical problem of the present invention, a display substrate is provided, which includes: a base substrate and a plurality of thin film transistors disposed on the base substrate, wherein the display substrate further includes one or more stress absorption units disposed on the base substrate between two adjacent thin film transistors.

In the display substrate provided by the present invention, by introducing the stress absorption units made of resin material into the display substrate, the stress generated by the display substrate when it is bent is released by the transparent resin material, and thus thin film transistors on the display substrate are less likely to be damaged, so that the reliability of the whole display substrate is improved.

Preferably, the display substrate further includes a plurality of insulating layers disposed on the base substrate; and the one or more stress absorption units are disposed in openings formed in any one or more of the insulating layers.

Preferably, the plurality of insulating layers are a gate insulating layer, an interlayer insulating layer and a first passivation layer sequentially disposed on the base substrate.

Preferably, the one or more stress absorption units are disposed in through holes penetrating through the gate insulating layer, the interlayer insulating layer and the first passivation layer.

Preferably, the one or more stress absorption units are disposed in openings of the same size formed in the gate insulating layer and the first passivation layer.

Preferably, the display substrate further includes anodes disposed above the thin film transistors and electrically connected to drains of the thin film transistors, respectively, and a luminous layer and cathodes are sequentially provided above the anodes; overlap regions of the anodes, the luminous layer and the cathodes form luminous regions; and the one or more stress absorption units are located under the corresponding luminous regions.

Preferably, the one or more stress absorption units are made of resin material.

Preferably, the resin material is acrylic resin or polyimide resin.

The present invention further provides a method for manufacturing a display substrate, including: preparing a base substrate; and arranging a plurality of thin film transistors on the base substrate; and the method further includes a step of arranging one or more stress absorption units on the base substrate between two adjacent thin film transistors.

The step of arranging one or more stress absorption units on the base substrate between two adjacent thin film transistors includes: on the base substrate arranging the one or more stress absorption units in openings formed in one or more of a plurality of insulating layers between two adjacent thin film transistors.

The step of on the base substrate arranging the one or more stress absorption units in openings formed in one or more of a plurality of insulating layers between two adjacent thin film transistors includes: forming, in the plurality of insulating layers between two adjacent thin film transistors, one or more through holes penetrating through these insulating layers by a patterning process; and filling the one or more through holes with resin material.

The step of on the base substrate arranging the one or more stress absorption units in openings formed in one or more of a plurality of insulating layers between two adjacent thin film transistors includes: forming, in two spaced insulating layers among the plurality of insulating layers between two adjacent thin film transistors, two openings by patterning processes; and filling the two openings with resin material.

The method for manufacturing a display substrate further includes: arranging, above the thin film transistors, anodes electrically connected to the drains of the thin film transistors, respectively; and sequentially arranging a luminous layer and cathodes above the anodes so that overlap regions of the anodes, the luminous layer and the cathodes form luminous regions.

Another object of the present invention is to provide a flexible display device. The flexible display device includes the above-mentioned display substrate.

In the display substrate, as the insulating layers are provided therein with stress absorption units, the toughness of the insulating layers is improved and the thin film transistors are less likely to be damaged when the display substrate is bent, so that the reliability of the whole flexible display device is improved.

1—Base substrate; 2—Gate insulating layer; 3—Interlayer insulating layer; 4—First passivation layer; 5—Gate; 6—Drain; 7—Active layer; 8—Source; 9—Stress absorption unit; 10—Anode; 11—Luminous layer; 12—Cathode; 13—Second passivation layer; 14—Thin film layer; 15—Pixel defining layer; and 16—Luminous region.

DETAILED DESCRIPTION OF THE EMBODIMENTS

To make those skilled in the art better understand the technical solutions of the present invention, the present invention will be further described as below in details with reference to the accompanying drawings and specific embodiments.

Embodiment 1

Figure 1:
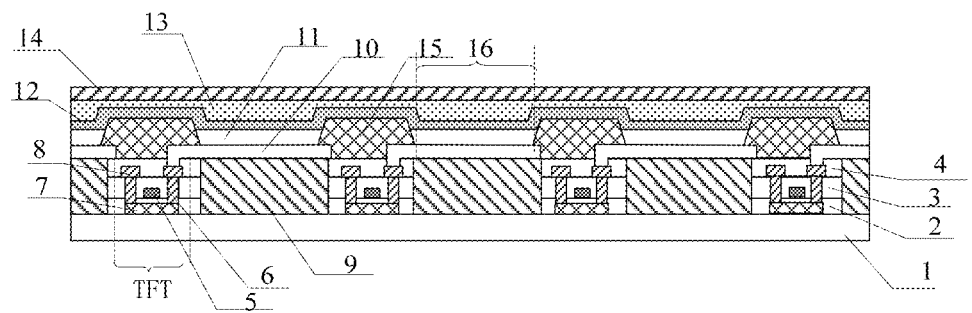
FIG. 1 is a sectional diagram of a display substrate with stress absorption units being disposed in through holes penetrating through gate insulating layer, interlayer insulating layer and first passivation layer in Embodiment 1.

As shown in FIG. 1, this embodiment provides a display substrate, including a base substrate 1 and a plurality of thin film transistors (TFT) disposed on the base substrate 1, and further including stress absorption units 9 disposed on the base substrate 1 between adjacent thin film transistors.

A gate insulating layer 2, an interlayer insulating layer 3 and a first passivation layer 4 are also provided on the base substrate 1 in turn. These insulating layers are made of $SiN_x$ or $SiO_x$ material and thus have poor toughness, so they are likely to be fractured when the display substrate is bent. To avoid the damage to the transistors due to the fracture of the insulating layers, stress absorption units are provided in the insulating layers of the display substrate in this embodiment of the present invention.

In Embodiment 1 as shown in FIG. 1, the stress absorption units 9 are disposed in through holes penetrating through the gate insulating layer 2, the interlayer insulating layer 3 and the first passivation layer 4 for purpose of partially replacing the gate insulating layer 2, the interlayer insulating layer 3 and the first passivation layer 4 to improve the toughness of the insulating layers.

For display substrates of different TFT structures, the specific number, structure and function of the insulating layers may be different. For example, there may be more than or less than three insulating layers.

The stress absorption units 9 are made of resin material, which may be acrylic resin, polyimide resin or other resins having elastic deformation capability. When the base substrate 1 is bent, the stress absorption units 9 are elastically deformed to absorb the stress generated by the base substrate 1 during deformation thereof, thereby preventing TFTs and similar devices from damages and ensuring the reliability of the devices.

The base substrate 1 may be a polyimide (PI) substrate, polyethylene glycol terephthalate (PET) substrate or other substrates of certain flexibility.

The TFTs in this embodiment are of a top gate structure and each TFT may include a source 8, a drain 6, an active layer 7 and a gate 5, etc. Certainly, the TFTs may also be of a bottom gate structure. The structure of the TFT is not limited in the present invention.

The display substrate in this embodiment may be an organic light-emitting diode display substrate, a liquid crystal display substrate, or an electronic paper display substrate, etc.

An anode 10 electrically connected to the drain 6 of the TFT may be provided above the TFT, and a luminous layer 11 and a cathode 12 are provided above the anode 10 in turn. Overlap region of the anode 10, the luminous layer 11 and the cathode 12 forms a luminous region 16. The stress absorption unit 9 is located under the luminous region 16.

A second passivation layer 13 and a thin film layer 14 may also be provided above the cathode 12 in turn.

In this embodiment, a structure in which the anode of the organic light-emitting diode is electrically connected to the drain of the TFT is employed. Of course, a structure in which the cathode of the organic light-emitting diode is electrically connected to the drain of the TFT may also be employed. In such a structure, the organic light-emitting diode is an inverted organic light-emitting diode.

Embodiment 2

Figure 2:
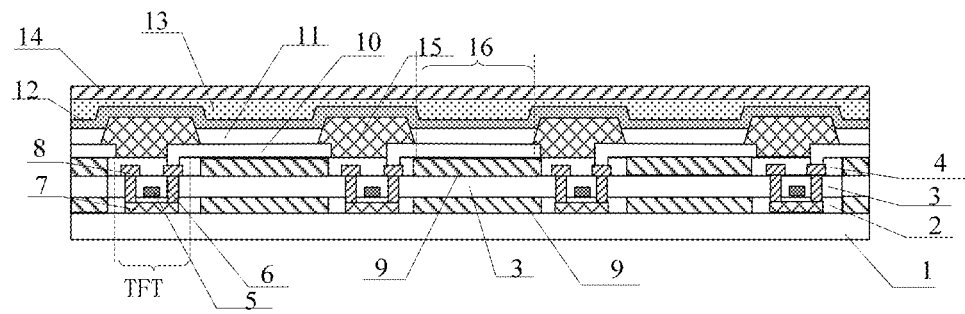
FIG. 2 is a sectional diagram of a display substrate with stress absorption units being disposed in openings formed in gate insulating layer and first passivation layer in Embodiment 2.

FIG. 2 shows a structural diagram of a display substrate according to Embodiment 2 of the present invention. A difference between the display substrate in this embodiment and the display substrate in Embodiment 1 lies in that: the stress absorption units 9 included in the display substrate according to Embodiment 2 of the present invention are only disposed in openings formed in the gate insulating layer 2 and the first passivation layer 4 for purpose of partially replacing the gate insulating layer 2 and the first passivation layer 4. Two stress absorption units 9 are provided on the display substrate between two adjacent thin film transistors, and the two stress absorption units 9 are spaced by the interlayer insulating layer 3 in a direction vertical to the base substrate 1. In FIG. 2, the two stress absorption units 9 between two adjacent thin film transistors are of a same size, as shown. The display substrate of such a structure may have the following advantages: as the two stress absorption units are of a same size and vertically spaced by the interlayer insulating layer 3, the stress generated by the display substrate when it is bent may be dispersed uniformly, so that the reliability of the device is ensured; in addition, a single mask plate may be used for patterning the gate insulating layer 2 and the first passivation layer 4 to form openings for filling the resin material thereinto to form the stress absorption units 9, thereby saving the process cost.

Of course, the present invention is not limited thereto. The stress absorption units 9 disposed in the openings formed in the gate insulating layer 2 and the first passivation layer 4 may be of different sizes, and the stress absorption units 9 may be disposed in openings formed in any one or more of the gate insulating layer 2, the interlayer insulating layer 3 and the first passivation layer 4. For example, two stress absorption units 9 may be only disposed in openings formed in the gate insulating layer 2 and the interlayer insulating layer 3 for purpose of only partially replacing the gate insulating layer 2 and the interlayer insulating layer 3 and may be of different sizes. For another example, three stress absorption units 9 of different sizes may be disposed in openings formed in the gate insulating layer 2, the interlayer insulating layer 3 and the first passivation layer 4.

Embodiment 3

Figure 3:
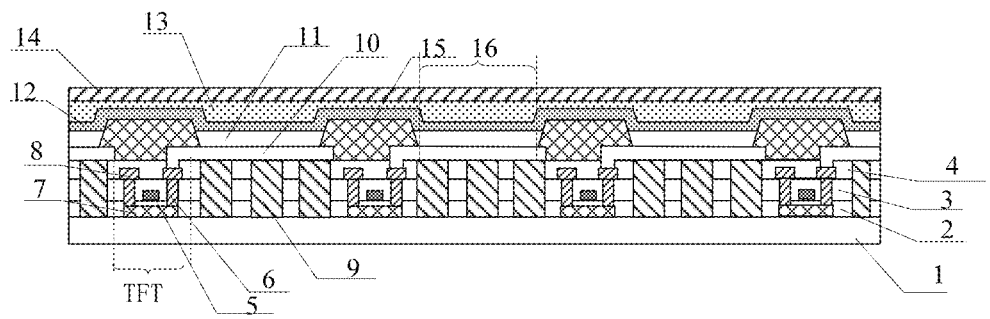
FIG. 3 is sectional diagram of a display substrate with a plurality of stress absorption units being disposed in through holes penetrating through gate insulating layer, interlayer insulating layer and first passivation layer in Embodiment 3.

FIG. 3 shows a structural diagram of a display substrate according to Embodiment 3 of the present invention. A difference between the display substrate in this embodiment and the display substrate in Embodiment 1 lies in that: in the display substrate according to Embodiment 3 of the present invention, three stress absorption units 9 are provided between two adjacent thin film transistors, and the three stress absorption units 9 are disposed in three openings penetrating through the gate insulating layer 2, the interlayer insulating layer 3 and the first passivation layer 4 and arranged at intervals in a direction parallel to the base substrate 1, for purpose of partially replacing the gate insulating layer 2, the interlayer insulating layer 3 and the first passivation layers 4. Specially, three openings penetrating through the gate insulating layer 2, the interlayer insulating layer 3 and the first passivation layer 4 are formed in the three insulating layers between two adjacent thin film transistors, and the three openings are filled with resin material to form three stress absorption units 9.

In Embodiment 3 as shown in FIG. 3, three stress absorption units 9 penetrating through the gate insulating layer 2, the interlayer insulating layer 3 and the first passivation layer 4 are provided between adjacent thin film transistors, but the present invention is not limited thereto. First, the number of the stress absorption units 9 is not limited to three; and second, the stress absorption units 9 are not limited to penetrating through three insulating layers, for example, the stress absorption units only penetrating through the gate insulating layer 2 and the interlayer insulating layer 3 but not penetrating through the first passivation layer 4 or stress absorption units only penetrating through the interlayer insulating layer 3 and the first passivation layer 4 but not penetrating through the gate insulating layer 2 may also achieve the object of the present invention.

The specific embodiments of the display substrate according to the present invention have been described by Embodiments 1-3, but the present invention is not limited thereto. In the present invention, by introducing stress absorption units made of transparent resin material into the insulating layers of the display substrate, the stress generated by the display substrate when it is bent is released by the resin material, and thin film transistors on the display substrate are thus less likely to be damaged, so that the reliability of the whole display substrate is improved. Therefore, any variation where stress absorption units made of transparent resin material are disposed in the insulating layers of the display substrate for purpose of improving the toughness of the insulating layers and thus enhancing the reliability of the whole display substrate shall fall into the protection scope of the present invention.

The present invention further provides a method for manufacturing a display substrate, including: preparing a base substrate; and arranging a plurality of thin film transistors on the base substrate, wherein the method further includes a step of arranging one or more stress absorption units between two adjacent thin film transistors on the substrate.

Embodiments of the method for manufacturing a display substrate according to the present invention will be specifically described as below with reference to the structural diagrams of the display substrate according to Embodiments 1-3 as shown in FIGS. 1-3.

First, an active layer 7, a gate insulating layer 2, gates 5, an interlayer insulating layer 3, sources 8, drains 6 and a first passivation layer 4 are formed on the base substrate 1. The preparation methods of the above layers belong to the prior art and will not be repeated here.

For the display substrate in Embodiment 1 as shown in FIG. 1, the manufacturing method may further include: etching off portions of the first passivation layer 4, the interlayer insulating layer 3 and the gate insulating layer 2 corresponding to the luminous regions 16 by a patterning process, and forming, between every two adjacent thin film transistors, one opening penetrating through the first passivation layer 4, the interlayer insulating layer 3 and the gate insulating layer 2; and filling the opening with resin material to form one stress absorption unit 9.

For the display substrate in Embodiment 2 as shown in FIG. 2, the manufacturing method may further include: after forming the gate insulating layer 2, etching the gate insulating layer 2 by a mask plate in a shape corresponding to the stress absorption unit 9 thus to form an opening in the gate insulating layer 2; then, filling the opening formed in the gate insulating layer 2 with resin material to form one stress absorption unit 9; forming the interlayer insulating layer 3 and the first passivation layer 4; forming an opening in the first passivation layer 4 in a similar way, and filling the opening formed in the first passivation layer 4 with the resin material to form another stress absorption unit 9, so that two stress absorption units 9 disposed between two adjacent thin film transistors and spaced by the interlayer insulating layer 3 in a direction vertical to the base substrate 1 may be obtained, as shown in FIG. 2.

For the display substrate in Embodiment 3 as shown in FIG. 3, the manufacturing method may further include: etching the first passivation layer 4, the interlayer insulating layer 3 and the gate insulating layer 2 by a mask plate in a shape corresponding to the stress absorption units 9, and forming three openings penetrating the three insulating layers between two adjacent thin film transistors; then, filling the three openings with transparent resin material to form three stress absorption units 9 arranged at intervals in a direction parallel to the base substrate 1 may be obtained, as shown in FIG. 3.

The filling of the openings with resin material may be in a manner of filling the resin material into the openings by printing such as ink-jet printing; and may also be in a manner of coating photosensitive resin material at the openings, then exposing and developing, removing the photosensitive resin material at non-opening portions, and the openings are filled with the resin material.

The method for manufacturing a display substrate according to the present invention has been exemplarily described above by the embodiments. The first passivation layer 4, the interlayer insulating layer 3 and the gate insulating layer 2 serving as the plurality of insulating layers may be different in a display substrate using different TFT structures, so the manufacturing method for a display substrate including stress absorption units 9 also covers display substrates of different structures.

The method for manufacturing a display substrate may further include: forming via holes on the first passivation layer 4 above the drains 6, and preparing anodes 10 by a patterning process. The preparation methods of the via holes and the anodes 10 belong to the prior art and will not be repeated herein.

The method for manufacturing a display substrate may further include: preparing a pixel defining layer 15, an organic luminous layer 11 and cathodes 12. The preparation methods of the above layers belong to the prior art and will not be repeated herein.

The method for manufacturing a display substrate may further include: preparing a second passivation layer 13 above the cathodes 12, coating a thin film layer 14 on the second passivation layer 13, thus the display substrate is packaged. Of course, adhesive may also be coated onto the second passivation layer 13, and a second substrate is adhered thereto by the adhesive and thus the display substrate is packaged.

The present invention further provides a flexible display device, including the above-mentioned display substrate. Preferably, the display substrate is a flexible organic light-emitting diode display substrate.

It should be understood that the foregoing embodiments are merely exemplary embodiments used for describing the principle of the present invention, but the present invention is not limited thereto. Any person of ordinary skill in the art may make various variations and improvements without departing from the spirit and essence of the present invention, and these variations and improvements shall fall into the protection scope of the present invention.

The invention claimed is:

1. A display substrate, comprising:
a base substrate, and
a plurality of thin film transistors disposed on the base substrate,
wherein the display substrate further comprises two stress absorption units disposed on the base substrate and between two adjacent thin film transistors of the plurality of thin film transistors, each of the two stress absorption units being separated from the two adjacent thin film transistors,
wherein the display substrate further comprises a plurality of insulating layers disposed on the base substrate, the plurality of insulating layers are a gate insulating layer, an interlayer insulating layer and a first passivation layer, which are sequentially disposed on the base substrate in the following order: the gate insulating layer disposed over the base substrate; the interlayer insulating layer disposed over the gate insulating layer; and the first passivation layer disposed over the interlayer insulating layer, and
wherein the two stress absorption units are disposed in openings formed in the gate insulating layer and the first passivation layer, respectively, and are separated from each other only by the interlayer insulating layer.

2. The display substrate according to claim 1, wherein the two stress absorption units are disposed in the openings of a same size formed in the gate insulating layer and the first passivation layer, respectively.

3. The display substrate according to claim 1, further comprising anodes disposed above the plurality of thin film transistors and electrically connected to drains of the plurality of thin film transistors, respectively, wherein a luminous layer is provided above the anodes, and then cathodes are provided above the luminous layer; overlap regions of the anodes, the luminous layer and the cathodes form luminous regions, respectively; and the two stress absorption units are located under the luminous regions, respectively.

4. The display substrate according to claim 2, further comprising anodes disposed above the plurality of thin film transistors and electrically connected to drains of the plurality of thin film transistors, respectively, wherein a luminous layer is provided above the anodes, and then cathodes are provided above the luminous layer; overlap regions of the anodes, the luminous layer and the cathodes form luminous regions, respectively; and the two stress absorption units are located under the luminous regions, respectively.

5. The display substrate according to claim 1, wherein the two stress absorption units are made of resin material.

6. The display substrate according to claim 5, wherein the resin material is acrylic resin or polyimide resin.

7. A method for manufacturing a display substrate, the method comprising:
preparing a base substrate; and
arranging a plurality of thin film transistors and a plurality of insulating layers on the base substrate,
wherein the plurality of insulating layers are a gate insulating layer, an interlayer insulating layer and a first passivation layer, which are sequentially disposed on the base substrate in the following order: the gate insulating layer disposed over the base substrate; the interlayer insulating layer disposed over the gate insulating layer; and the first passivation layer disposed over the interlayer insulating layer, and
wherein the method further comprises:
a step of arranging two stress absorption units on the base substrate and between two adjacent thin film transistors of the plurality of thin film transistors such that the two stress absorption units are disposed in openings formed in the gate insulating layer and the first passivation layer, respectively, and are separated from each other only by the interlayer insulating layer, each of the two stress absorption units being separated from the two adjacent thin film transistors.

8. The method according to claim 7, wherein the step of arranging the two stress absorption units on the base substrate and between the two adjacent thin film transistors such that the two stress absorption units are disposed in the openings formed in the gate insulating layer and the first passivation layer, respectively, comprises:
forming, in the gate insulating layer and the first passivation layer between the two adjacent thin film transistors, two through holes penetrating through the gate insulating layer and the first passivation layer, respectively, by a patterning process; and
filling the two through holes with resin material.

9. The method according to claim 7, further comprising:
arranging, above the plurality of thin film transistors, anodes electrically connected to drains of the plurality of thin film transistors, respectively; and
sequentially arranging a luminous layer and cathodes above the anodes so that overlap regions of the anodes, the luminous layer and the cathodes form luminous regions, respectively.

10. The method according to claim 7, wherein the two stress absorption units are made of resin material.

11. The method according to claim 10, wherein the resin material is acrylic resin or polyimide resin.

12. A flexible display device, comprising:
a display substrate, the display substrate comprising:
a base substrate, and
a plurality of thin film transistors disposed on the base substrate,
wherein the display substrate further comprises two stress absorption units disposed on the base substrate and between two adjacent thin film transistors of the plurality of thin film transistors, each of the two stress absorption units being separated from the two adjacent thin film transistors,
wherein the display substrate further comprises a plurality of insulating layers disposed on the base substrate, the plurality of insulating layers are a gate insulating layer, an interlayer insulating layer and a first passivation layer, which are sequentially disposed on the base substrate in the following order: the gate insulating layer disposed over the base substrate; the interlayer insulating layer disposed over the gate insulating layer; and the first passivation layer disposed over the interlayer insulating layer, and
wherein the two stress absorption units are disposed in openings formed in the gate insulating layer and the first passivation layer, respectively, and are separated from each other only by the interlayer insulating layer.

* * * * *